(12) United States Patent
Pradeep et al.

(10) Patent No.: US 6,451,704 B1
(45) Date of Patent: Sep. 17, 2002

(54) METHOD FOR FORMING PLDD STRUCTURE WITH MINIMIZED LATERAL DOPANT DIFFUSION

(75) Inventors: Yelehanka Ramachandramurthy Pradeep; Subrahmanyam Chivukula; Jie Ye; Madhudsudan Mukhopdhyay, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/849,672

(22) Filed: May 7, 2001

(51) Int. Cl.[7] .............................................. H01L 21/00
(52) U.S. Cl. ...................... 438/719; 438/723; 438/724; 438/740; 438/692; 438/745
(58) Field of Search ............................. 438/692, 712, 438/719, 723, 724, 740, 743, 744, 745, 197, 279, 283; 216/67, 79

(56) References Cited

U.S. PATENT DOCUMENTS

| | | | |
|---|---|---|---|
| 5,399,506 A | | 3/1995 | Tsukamoto ................... 437/19 |
| 5,872,059 A | * | 2/1999 | Doan et al. .............. 438/719 X |
| 5,998,272 A | | 12/1999 | Ishida et al. ................. 438/305 |
| 6,057,241 A | * | 5/2000 | Matsuda et al. ........ 438/719 X |
| 6,057,243 A | * | 5/2000 | Nagayama ............... 438/719 X |
| 6,074,906 A | | 6/2000 | Cheek et al. ................ 438/231 |
| 6,083,846 A | * | 7/2000 | Fulford et al. .......... 438/719 X |
| 6,103,563 A | | 8/2000 | Lukane et al. .............. 438/231 |

* cited by examiner

Primary Examiner—William A. Powell
(74) Attorney, Agent, or Firm—George O. Saile; Rosemary L. S. Pike

(57) ABSTRACT

A new method is provided for the creation of PLDD regions that is aimed at reducing lateral p-type impurity diffusion. The process starts with a silicon substrate on the surface of which gate electrodes have been created. An NLDD implantation is performed self-aligned with the NMOS gate electrode, a layer of oxide (oxide liner) is deposited over the structure over which a layer of nitride is deposited over which a first layer of top oxide is deposited. First gate spacers are formed by etching the first layer of top oxide, stopping on the nitride layer. NS/D and PS/D implantations are performed self-aligned with respectively the NMOS and the PMOS devices, the S/D implantations are annealed. The first gate oxide spacers are removed, a PLDD implantation is performed self-aligned with the PMOS gate electrode. A second layer of top oxide is deposited over the structure and etched to form the second gate spacers on the sidewalls of the NMOS and PMOS gate electrodes. After this sequence of processing steps has been completed, the gate electrodes can be completed following conventional methods of gate electrode processing.

44 Claims, 3 Drawing Sheets

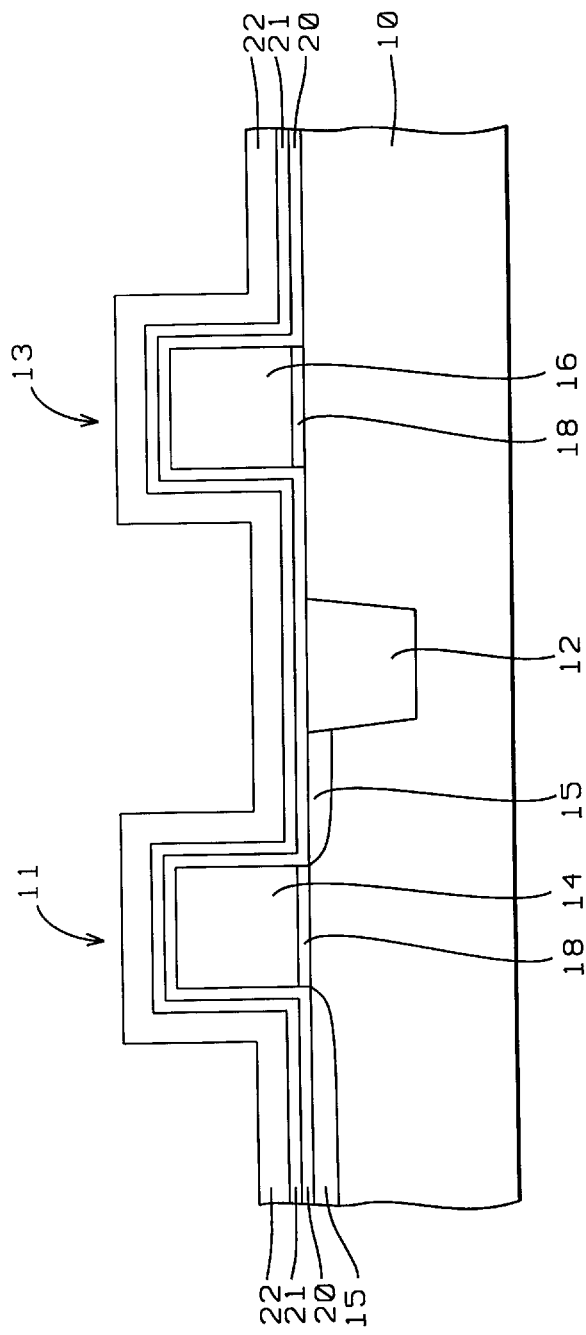
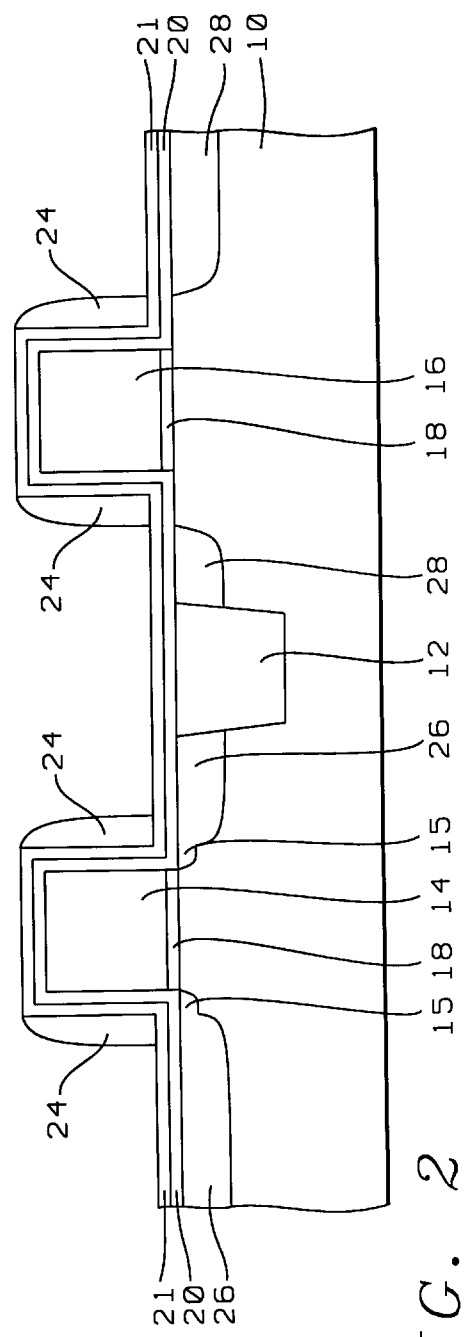
FIG. 1
FIG. 2

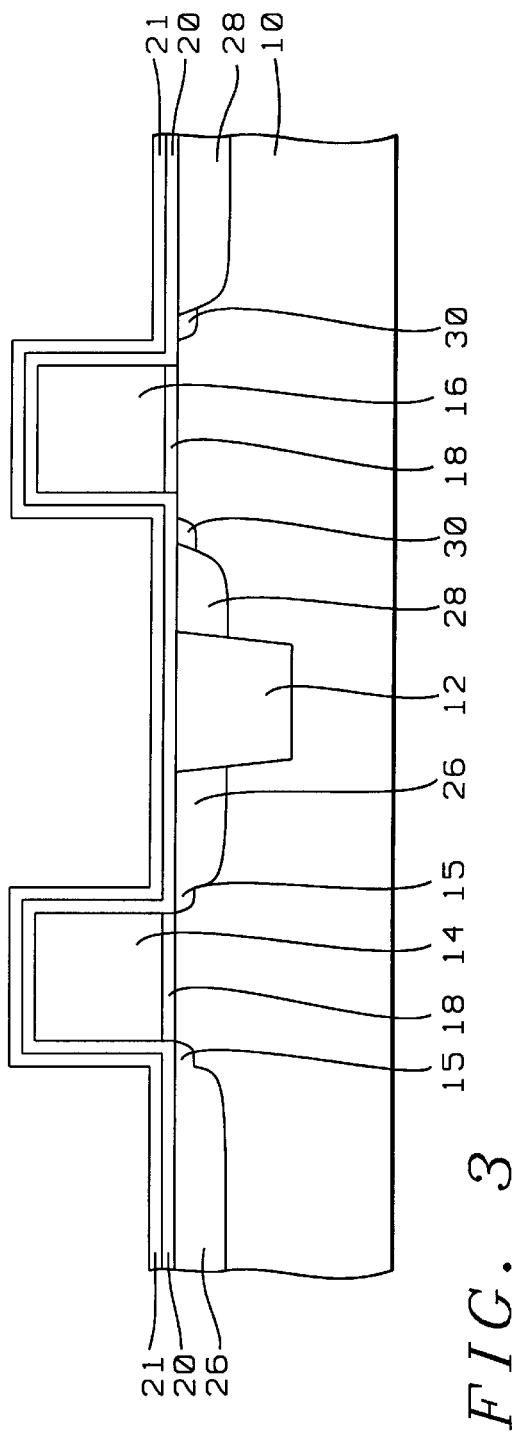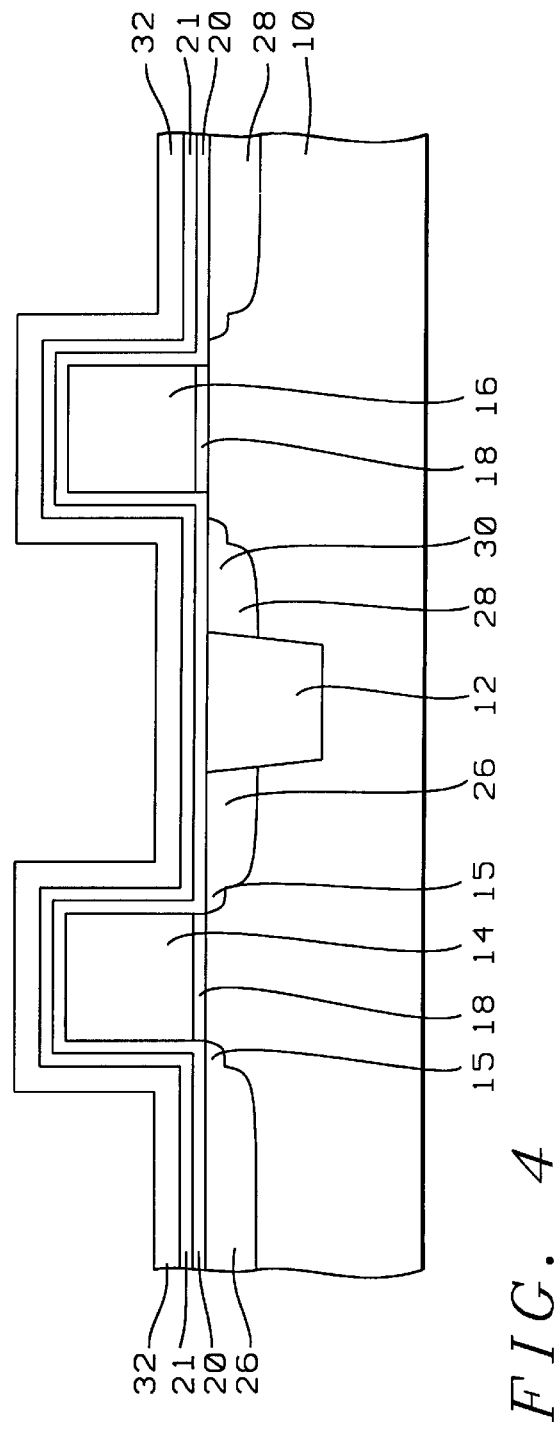

METHOD FOR FORMING PLDD STRUCTURE WITH MINIMIZED LATERAL DOPANT DIFFUSION

BACKGROUND OF THE INVENTION

(1) Field of the Invention

The invention relates to the fabrication of integrated circuit devices, and more particularly, to a method of performing p-type implantation in the Lightly Doped Diffusion (PLDD) area of a gate electrode, preventing diffusion of boron as the p-type impurity. This more specifically for gate electrodes with submicron channel length.

(2) Description of the Prior Art

Semiconductor technology has for many years made progress by a continued effort to decrease device dimensions in order to improve Integrated Circuit (IC) device performance. Metal Oxide Semiconductor Field Effect Transistor (MOSFET) devices form an increasing percentage of the total number of devices that are used in Integrated Circuit (IC) applications. MOSFET devices are expected to continue to increase in importance, it is expected that by the year 2000 MOSFET devices will constitute roughly 90% of the overall market. Reduction in device dimensions results in a reduction in device power consumption. It is an accepted rule in semiconductor technology that device speed varies inversely with the length of device features, device power consumption increases approximately with the square of the device feature length. Current semiconductor technology approaches feature size in the micron and sub-micron or 0.5 $\mu$m range where a number of applications already use feature size of about 0.2 $\mu$m.

Field Effect Transistors (FET) are used extensively in Ultra Large Scale Integration (ULSI) applications. FET devices are formed using gate electrodes, usually made of polysilicon, and adjacent self-aligned source/drain regions to which source/drain contact surfaces are established. In its basic form, a Metal Oxide Semiconductor (MOS) transistor has a gate electrode to which a voltage is applied. The gate is created on the surface of a silicon substrate, the voltage that is applied to the gate creates an electric field that is perpendicular to the interface between the gate electrode and the substrate. The areas in the substrate immediately adjacent to the gate electrode are doped, thereby varying their electric conductivity. These areas become the source and drain regions. By varying the voltage that is applied to the gate electrode, the electric field in the interface between the gate and the substrate can be varied and, with that, the current that flows between the source and the drain regions. This electric field controls the flow of current through the device from which the name of Field Effect Transistor has been derived.

The type of device that is created and the type of areas that are created in conjunction with the device are to a large extent determined by the type of dopant that is used and the processing conditions under which the dopants are applied. The creation of semiconductor devices typically starts with a bare monocrystalline silicon substrate, which is any material that can retain dopant ions. Isolated active regions are created in the surface of the substrate. The silicon substrate further receives p-type or n-type ions (impurity implants) for the creation of various conductivity regions in or on the surface of the substrate. The device features that are created in or on the surface of the substrate dictate the type of doping and the doping conditions. For instance, boron or phosphorous can be used as respectively p-type and n-type dopants and can be doped into polysilicon layers or into polycide gate electrodes.

MOS devices are typically created on the surface of a substrate after either a p-type or a n-type impurity has been implanted in the surface of the substrate, creating wells in this surface of either p-type or n-type conductivity. NMOS devices (also referred to as n-channel devices) are, after that, created on the surface of a p-type well, PMOS devices (also referred to as p-channel devices) are created on the surface of an n-type well. The type of channel underlying a MOS gate electrode is determined by the type of conductivity of the channel that is developed under the transverse electric field of the gate electrode. Therefore, in an n-channel of NMOS devices, the conductivity of the channel underlying the transverse electrical field of the gate electrode is of the conductivity type that is associated with n-type impurities such as arsenic or phosphorous. For p-channel (PMOS) devices, these impurities comprise boron or indium. After the gate electrode has been created, Lightly Doped Diffusions (LDD) are typically implanted in the surface of the substrate, self aligned with the gate electrode, whereby n-type impurities are use for the LDD regions of NMOS devices and p-type impurities for the LDD regions of PMOS devices. After this, the gate electrode is isolated by the formation of gate spacers on the sidewalls of the gate electrode, this is followed by forming the source and drain regions of the gate electrodes. For the source/drain implants the same type impurities are used as have been used for the LDD implants, the difference between the LDD implants and the source/drain implants is that the source/drain implants are typically performed at higher implant energy and dosage that the LDD implants. In this manner the p-type implants (for PMOS devices) of the source/drain regions (PS/D) and the n-type implants (for NMOS devices) of the source/drain regions (NS/D) penetrate deeper into the surface of the substrate than the corresponding p-type (PLDD) and n-type (NLDD) implants for the LDD regions.

Dual gate transistor design is the design where both NMOS and PMOS devices are created on the same chip. Earlier designs of Metal Oxide Semiconductor (MOS) devices primarily used PMOS design because only with p-channel devices using n$^+$-doped polysilicon gates and uniform lightly doped n-substrates could acceptable values for V$_t$ be attained. In its early history, the Complementary Metal Oxide Semiconductor (CMOS) transistor was considered to be only an extension of the design for MOS IC's. Later advancements in fabrication technology, mostly due to improvements in ion implant techniques, allowed for PMOS devices to be replaced with NMOS devices. The larger drive current of NMOS devices results in faster speed of these devices, which results in NMOS devices becoming the dominant type of device in the IC industry. NMOS devices however exhibited severe limitations in power density and power dissipation, causing CMOS devices to become the dominant technology for IC device manufacturing. With the arrival of CMOS devices, a renewed interest in PMOS devices developed. CMOS employs both NMOS and PMOS devices to form logic elements. The advantage of CMOS is that its logic devices draw significant current only during the transition from one logic state to the other while drawing very little current between this transition.

The scaling of the CMOS devices in the sub-micrometer device range presents a major challenge. For the fabrication of pchannel and n-channel devices, n doped polysilicon gates are used resulting in functional asymmetry. A number of techniques have been used to assure that the p-channel and n-channel devices are completely symmetrical in their performance characteristics such as threshold voltages, device dimensions and doping while the p-channel device is,"

for ease of manufacturing, a surface channel device. These devices are made using undoped polysilicon for the gate structures that are simultaneously doped at the time that the source/drain regions of each type of device are implanted. This leads to special manufacturing problems caused by, among others, diffusion of impurity implants through the gate oxide into the channel region thereby changing the threshold voltage of the device. Another concern in creating dual-gate CMOS devices is that various dopants may interdiffuse between adjacent regions, an effect that can become critical at high anneal and other processing temperatures.

Increased CMOS device speed however requires short channel length, the design of p-channel devices with short channel length presents unique problems mostly centered on methods of doping and pocket implants for the device and on the impact that these methods have on PMOS device characteristics. A technique used for instance to create deeper and narrower implants is to increase implant energy and implant dosage. This approach however may negate the self-alignment aspect of the implants where the gate electrode serves as a shield and the implants become in this way aligned around the gate electrode. The high implant energy and dosage may result in implant penetration through the gate electrode, thereby affecting the gate threshold voltage performance while the high implant energy and dosage may further affect the thin layer of gate oxide underlying the gate electrode. It is therefore critical to design an implant method and sequence where gate penetration by implant dopants is not a factor.

Various types of implants are used in the industry to create semiconductor devices. Implants can be a well implant, which is performed to provide a more uniform background doping in the surface of the substrate. A punch-through implant provides a channel with greater robustness to punch-through voltage. A thresh-hold implant sets the thresh-hold voltage of a device (like an IGFET).

A p-well implant can be provided by boron at a dose in the range of $1 \times 10^{12}$ to $1 \times 10^{13}$ atoms/cm$^2$ and an energy in the range of 100 to 170 kilo-electron volts, a punch-through implant can be provided by boron at an dose in the range of $1 \times 10^{12}$ to $1 \times 10^{13}$ atoms/cm$^2$ and an energy in the range of 40 to 100 kilo electron volts, the thresh-hold implant can be provided by boron at a dose in the range $1 \times 10^{12}$ to $1 \times 10^{13}$ atoms/cm$^2$ and an energy in the range of 1 to 30 kilo electron volts. A channel implant can have a boron concentration on the order of $1 \times 10^{17}$ atoms/cm$^2$. Implants can also use arsenic; this can form an n-doped region. A heavy doped implant for instance is $3–5 \times 10^{15}$/cm$^2$ of arsenic at 50–80 keV.

Decreasing device dimensions has resulted in decreasing the channel length of gate electrodes, that is the lateral distance between the source and drain regions of the gate electrode is reduced to where this dimension approaches 0.2 $\mu$m or less. As the channel length is reduced, the gate electrode must also be reduced in the vertical direction, which further brings with it a reduction in the distance that the source/drain regions can penetrate into the surface of the substrate. This latter requires precise control of the distribution of the impurity dopant of the source and drain regions. This problem is further aggravated where salicided regions are created on the surface of the source/drain regions in order to reduce contact resistivity to these regions. The selective growth of the salicide that is needed for good contact resistance with the metalization layer requires a reaction between the deposited layer of salicide material, for instance titanium, and the underlying silicon. The titanium that is formed on the surface of the contact regions (source/drain regions) must be wide enough to accommodate the photolithographic limitations in forming contact openings to the source/drain regions. This results in a wider device. Also, since silicon is consumed in this process, the junction depth of the source/drain regions is difficult to control and dopant depletion can occur in these regions. Furthermore, formation of the deep, heavily doped junctions for the source/drain regions can result in dopant diffusion under the gate region thereby reducing the effective channel length of the MOSFET, leading to the so-called "short channel effect".

One of the key factors that affects the reliability of FET devices of small geometry is caused by the shrinkage of the channel length and channel width. To overcome problems associate with short and narrow channel effects is therefore an important concern in the design of FET devices. Gate oxide integrity can also be negatively affected by the hot-carrier effect. If the carriers can acquire sufficient energy from the lateral electric field (the field parallel to the plane of the substrate surface), these carriers may transfer across the substrate to the gate oxide interface thereby affecting the oxide conduction band and, ultimately, its function of forming a gate oxide layer of electrical separation. The electric field barrier for electron injection is smaller than it is for hole injection. This problem is therefore more prominent in n-channel MOSFET's because electrons form the charge carrier in the device channel.

Specifically addressed by the invention are concerns of gate electrode design that arise as the physical geometry of the gate electrode is reduced. With this reduction the channel length is also reduced, creating the previously indicated short channel effect. In particular, in creating PLDD structures for which boron is used as an impurity implant, the tendency of high diffusivity of boron into the surrounding silicon substrate affects the threshold voltage and the device drive current, thus affecting the PMOS device performance characteristics.

In a typical processing flow, PLDD implantation is performed before S/D implantation and anneal of the implanted impurities. This anneal step will further enhance the diffusion of the boron from the PLDD regions into the silicon underneath the gate electrode. This invention addresses this latter aspect of CMOS gate design.

U.S. Pat. No. 6,103,563 (Lukanc et al.) shows a process where the NLDD, NS/D and PS/D are formed and annealed, then PLDD is formed. See FIGS. 2a to 2h, also see col. 5, lines 7 to 43. In comparing U.S. Pat. No. 6,103,563 (Lukanc et al.) with the instant invention, it must be pointed out that U.S. Pat. No. 6,103,563 (Lukanc et al.) is not compatible with the salicide process. In addition, U.S. Pat. No. 6,103,563 (Lukanc et al.) is aimed at reducing the mask count and not at reducing the lateral diffusion of dopant. Even though the PS/D implant is performed prior to the PLDD implant, the photoresist mask is still in place at the time of the PS/D implant, which is not suitable for the S/D annealing process. Therefore, under U.S. Pat. No. 6,103,563 (Lukanc et al.) the S/D anneal must be performed after the PLDD implant and after the removal of the photoresist. This approach does not reduce lateral dopant diffusion.

U.S. Pat. No. 5,998,272 (Ishida et al.) discloses a "reverse LDD" process where the LDD is formed after the S/D anneal. In comparing this invention with the instant invention, it must be pointed out that the process flow that is provided by U.S. Pat. No. 5,998,272 (Ishida et al.) is not compatible with the creation of borderless contacts. With zero exclusion, the borderless contact can, under U.S. Pat. No. 5,998,272 (Ishida et al.), land partially on the surface of the STI region. This may cause the occurrence of leakage current (between the contact to the source/drain regions and the surface of the STI regions) or, in a worst case scenario, a short may occur (between the contact to the S/D regions and the surface of the STI regions). In addition, the process flow of U.S. Pat. No. 5,998,272 (Ishida et al.) is not compatible with self-aligned contacts (SAC). The process that is provided by U.S. Pat. No. 5,998,272 (Ishida et al.) contains spacers or, even in the case where no spacers are provided, this approach is not suitable for the SAC process. Typically, the SAC process uses a hard mask for the gate electrode and uses nitride as an etch stop layer for the etching of the gate spacers.

U.S. Pat. No. 6,074,906 (Cheek et al.) and U.S. Pat. No. 5,399,506 (Tsukamoto) show related processes.

SUMMARY OF THE INVENTION

A principle objective of the invention is to reduce lateral diffusion of boron impurities into adjacent channel regions for application where a boron impurity is used as a p-type impurity implant for the creation of Lightly Doped Diffusion (LDD) regions for a PMOS device.

Another objective of the invention is to provide a method for the creation of CMOS devices whereby the diffusion of p-type LDD impurities that is caused by the anneal process of the LDD implant is removed.

Yet another objective of the invention is to provide a method for the elimination of PLDD diffusion of boron into adjacent silicon of the substrate that can be applied to the creation of PMOS devices that have a sub-micron channel length.

In accordance with the objectives of the invention a new method is provided for the creation of PLDD regions that is aimed at reducing lateral p-type impurity diffusion. The process starts with a silicon substrate on the surface of which gate electrodes have been created. An NLDD implantation is performed self-aligned with the NMOS gate electrode, a layer of oxide (oxide liner) is deposited over the structure over which a layer of nitride is deposited over which a first layer of top oxide is deposited. First gate spacers are formed by etching the first layer of top oxide, stopping on the nitride layer. NS/D and PS/D implants are performed self-aligned with respectively the NMOS and the PMOS devices, the S/D implantations are annealed. The first gate oxide spacers are removed, a PLDD implantation is performed self-aligned with the PMOS gate electrode. A second layer of top oxide is deposited over the structure and etched to form the second gate spacers on the sidewalls of the NMOS and PMOS gate electrodes. After this sequence of processing steps has been completed, the gate electrodes can be completed following conventional methods of gate electrode processing.

BRIEF DESCRIPTION OF THE DRAWINGS

FIG. 1 shows a cross section of a semiconductor surface, a STI region has been defined in the surface of the substrate. A PMOS and a CMOS gate electrode have been created on the surface, an NLDD implantation has been performed, an oxide liner has been deposited over which a layer of nitride has been deposited. A first layer of top oxide has been deposited over the layer of nitride.

FIG. 2 shows a cross section of the structure of FIG. 1 after the first layer of top oxide has been etched, stopping on the nitride layer, creating first oxide spacers on the sidewalls of the gate electrodes. NS/D and PS/D implantations have been performed, the S/D implants have been annealed.

FIG. 3 shows the cross section of FIG. 2 after the oxide spacers have been removed from the sidewalls of the gate electrodes, PLDD implantation has been performed.

FIG. 4 shows the cross section of FIG. 3 after a second layer of top oxide has been deposited.

DESCRIPTION OF THE PREFERRED EMBODIMENTS

Figure 5:
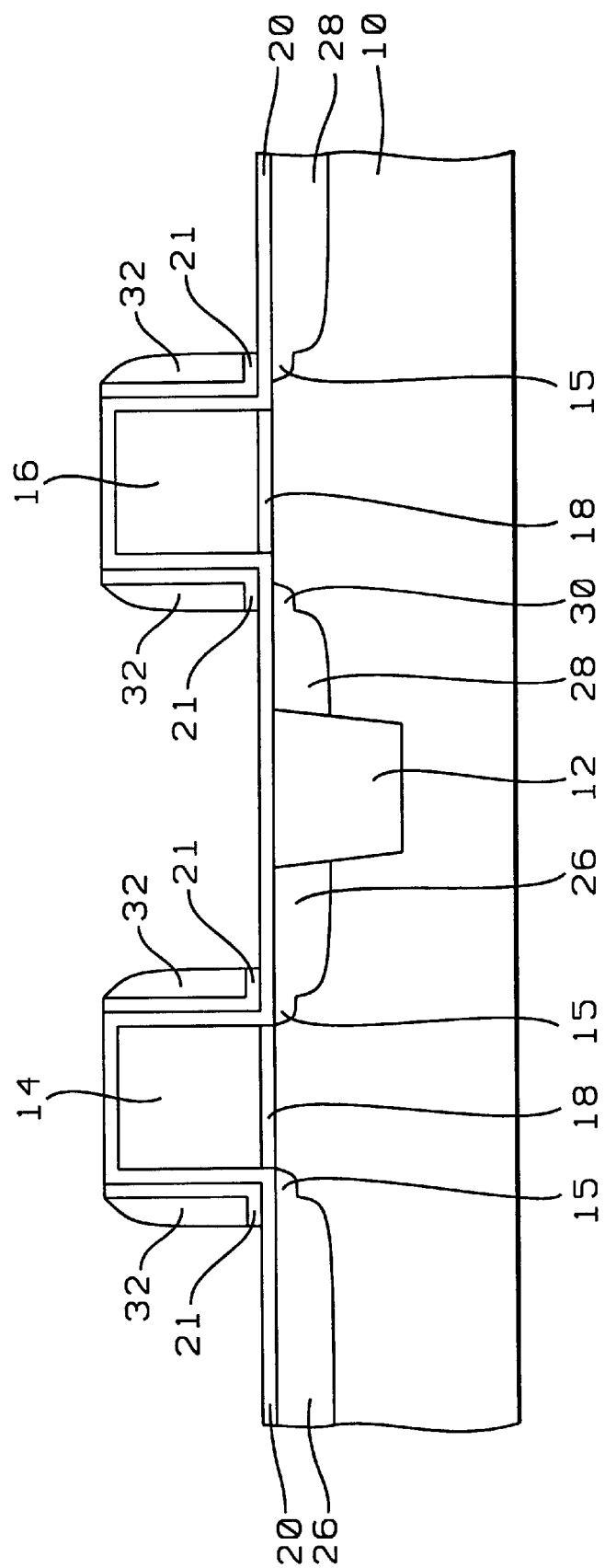
FIG. 5 shows the cross section of FIG. 4 after the second layer of top oxide has been etched, stopping on the oxide liner layer, creating second oxide spacers on the sidewalls of the gate electrodes. The layer of nitride has been removed from the surface of the substrate.

Referring now specifically to FIG. 1, there is shown a cross section of a semiconductor surface 10, further shown in cross section in FIG. 1 are:

12, a STI region defined in the surface of the substrate 10, this STI region electrically isolates the NMOS device 11 from the PMOS device 13 that have been created on the surface of substrate 10

11, a NMOS device created on the surface of substrate 10

13, a PMOS device created on the surface of substrate 10

14, the body of the gate electrode of the NMOS device 11

16, the body of the gate electrode of the PMOS device 13

15, an NLDD implant that has been performed into the surface of substrate 10, self-aligned with the NMOS gate 11

18, a layer of pad oxide that has been formed over the surface of substrate 10 prior to the formation of the gate electrodes 11 and 13

20, a liner layer of oxide has been deposited over the surface of the substrate, including the surface of the gate electrodes 11 and 13

21, a layer of nitride that has been deposited over the surface of the layer 20 of oxide liner 22, a first layer of top oxide, deposited over the surface of layer 21 of nitride.

STI regions 12 can be created using a number of methods. For instance, one method is the method of creating Buried Oxide (BOX) isolation used for shallow trenches. The method involves creating trenches in the surface of substrate 10, filling the trenches with a chemical vapor deposition (CVD) of silicon oxide ($SiO_2$) and then etching or mechanically or chemically polishing the surface of the deposited silicon oxide in order to create a planar surface. The shallow trenches that are etched for the BOX process are anisotropically plasma etched into the silicon substrate and are typically between 0.2 and 0.5 $\mu$m deep. STI regions are typically formed in the surface of a substrate around active devices that are formed in or on the surface of the substrate, to a depth between about 2000 and 5000 Angstrom. Another approach in forming STI regions 12 in the surface of substrate 10 is to deposit silicon nitride on a layer of oxide that has been thermally grown on the surface of substrate 10. After deposition of the nitride, a shallow trench is etched into the substrate 10 using a mask. A layer of oxide is then deposited into the trench so that the trench forms an area of insulation dielectric, which acts to isolate the active devices. The excess deposited oxide is polished off and the trench planarized to prepare for the next level of metalization. The silicon nitride serves as a stop layer for the CMP polishing.

Typically, a blanket layer 18 of pad oxide can be formed over the surface of a silicon substrate through a thermal oxidation method at a temperature of about 900 degrees C. for a time period of about 10 to 20 minutes. A layer of pad oxide is typically formed to a thickness of about 150 Angstrom.

For the creation of a typical gate electrode such a gate electrode 14 and 16 shown in cross section in FIG. 1, a layer of polysilicon is deposited over the layer 18 of gate oxide and etched using photolithography followed by anisotropic poly etch. The etch to form the body of the gate electrode removes the layer of poly and the layer of gate oxide from above the surface of substrate 10 in accordance with the pattern of the gate electrodes 11 and 13.

After the gate electrodes 11 and 13 have been created, comprising the layers 18/14 and 18/16, a self aligned NLDD implant 15 is performed into the surface of the substrate 10.

The NLDD implant 15 is and NMOS implant, typically performed using arsenic or phosphorous ions as a n-type impurity source whereby the ions are implanted with an implant energy of between about 1 to 10 KeV and an ion concentration of between about 1E14 and 1E16 atoms/cm$^2$.

Layer 20 is an oxide liner, layer 21 is a layer of silicon nitride. Combined, these two layer form a passivation layer formed over the surface of the substrate 10 and the gate electrodes 11 and 13. Passivation layers typically contain an oxide or nitride, they can also contain $SiO_2$ that is deposited by plasma at low temperatures, a SACVD oxide layer, a plasma enhanced nitride layer, a LPCVD oxide. Silicon nitride is used as a passivation layer due to its ability to provide an impermeable barrier to moisture and mobile impurities (e.g. sodium ions). Silicon nitride also forms a tough coating that protects an underlying integrated circuit against mechanical damage.

Layer 20 of oxide liner is native oxide or thermally grown oxide or CVD deposited oxide, to a thickness of between about 100 and 500 Angstrom, layer 21 of nitride is deposited next.

Layer 21 of silicon nitride is deposited over the surface of the oxide liner layer 20. The layer 21 of silicon nitride ($Si_3N_4$) can be deposited using LPCVD or PECVD procedures at a pressure between about 300 mTorr and 400 mTorr, at a temperature between about 600 and 800 degrees C., to a thickness of between about 2000 and 3000 Angstrom using $NH_3$ and $SiH_4$. The silicon nitride layer 20 can also be deposited using LPCVD or PECVD procedures using a reactant gas mixture such as dichlorosilane ($SiCl_2H_2$) and amonia ($NH_3$).

Layer 22 of top oxide can be grown on the surface of the deposited layer 21 of nitride in a low power furnace. This at a temperature within the range between 750 and 800 degrees C. for a time period within the range between 30 and 60 minutes to a thickness between about 1000 and 5000 Angstrom. Layer 22 forms the base layer for the creation of first (sacrificial) gate spacers for the gate electrodes 11 and 13.

Gate spacers for gate electrodes are typically created using a variety of materials such as silicon oxide, BSG, PSG, other materials preferably of a dielectric nature, CVD oxide formed from a TEOS source. The preferred material of the invention for layer 22 is silicon dioxide ($S_iO_2$), deposited over the surface of the layer 21 of silicon nitride using LPCVD procedures (for better step coverage) at a pressure between about 200 mTorr and 800 mTorr, at a temperature between about 600 and 800 degrees C., deposited to a thickness between about 1000 and 5000 Angstrom using TEOS. The silicon oxide layer 22 can also be deposited using LPCVD procedures using a reactant gas mixture such as dichlorosilane ($SiCl_2H_2$) and $O_2$.

FIG. 2 shows a cross section of the structure of FIG. 1 after the layer 22 of top oxide has been etched, stopping on the nitride layer 21. Shown in FIG. 2 are:

first oxide spacers 24 created on the sidewalls of the gate electrodes 11 and 13

NS/D implant 26 has been performed

PS/D implant 28 has been performed, and the source/drain implants (NS/D and PS/D) have been annealed (highlighted in FIG. 2 only by the depth of the penetration of the NS/D and PS/D implants).

First gate spacers 24 can be formed by etching first top oxide layer 22 (FIG. 1) using $Ar/CF_4$ as an etchant at a temperature of between about 120 and 160 degrees C. and a pressure of between about 0.30 and 0.40 Torr for a time of between about 33 and 39 seconds using a dry etch process. Silicon oxide spacers 24 can also be formed via anisotropic RIE of said silicon oxide layer, using $CHF_3$ or $CF_4$—$O_2$—He as an etchant.

Source and drain region implants can be performed under different processing conditions, dependent on device requirements. For instance a first conductivity imparting dopant using phosphorous can be implanted to create lightly doped n-type source and drain regions for NMNS devices (NS/D), ion implanted at an energy between about 5 to 60 KeV, at a dose between about 1E12 to 1E14 atoms/cm$^2$. A second conductivity imparting dopant can be used to create medium doped source and drain regions, such as arsenic or phosphorous, ion implanted at an energy between about 5 to 60 KeV, at a dose between about 1E13 to 5E14 atoms/cm$^2$. A third conductivity imparting dopant can be used to create heavily doped source and drain regions, such as arsenic, ion implanted at an energy between about 5 to 60 KeV, at a dose between about 1E15 to 5E15 atoms/cm$^2$.

Implant conditions for p-type implants are similar to the above indicated implant conditions for n-type implants. It is clear that p-type implants (of for instance indium or boron) are used to create source/drain regions that are self-aligned with PMOS (p-channel) devices while n-type implants (of for instance arsenic or phosphorous) are used to create source/drain regions that are self-aligned with PMOS (n-channel) devices.

After implants 26 and 28 have been completed, the implants are annealed to activate the dopants by rapid thermal annealing in a temperature range of between about 600 and 800 degrees C. for a time between about 20 and 40 seconds at a pressure below about $10^{-6}$ Torr.

FIG. 3 shows the cross section of the semiconductor surface 10 of FIG. 2 after the first oxide spacers 24 have been removed from the sidewalls of the gate electrodes 11 and 13. In addition, PLDD 30 implant has been performed. Implant 30 is a PMOS implant using boron ($BF_2$) with an implant energy within the range of between about 1 to 10 keV and a dose within the range of between about 1e14 to 5e15 atoms/cm$^2$.

Gate spacers 24 can be removed etching using $Ar/CF_4$ as an etchant at a temperature of between about 120 and 160 degrees C. and a pressure of between about 0.30 and 0.40 Torr for a time of between about 33 and 39 seconds using a wet etch process. The removal of the gate spacers 24 uses the layer 21 of nitride as an etch stop layer, as can be seen in FIG. 3.

It must be emphasized in the cross section that is shown in FIG. 3 that the oxide that is used to fill the STI trench 12 is at this time protected by layer 21 of silicon nitride.

It must also be noted that the PLDD implantation is performed as the last and final step in creating the source/drain regions of the gate electrodes. It must further be noted in FIG. 3 that the PLDD implant 30 is made at a time where the layer 21 of silicon nitride is still in place, overlying layer 20 of oxide liner. The significance of this is that the PLDD implant 30 is self-aligned with the gate electrode 13 over the surface of which layers 20 (of oxide liner) and 21 (of silicon nitride) are in place. This results in a PLDD implant that is, although self-aligned with the gate electrode 13, symmetrically removed from gate electrode 13 by the combined thickness of layers 20 and 21. This, combined with the anneal for the S/D regions which is performed prior to the PLDD implant, addresses the objective of the invention. That is: "to reduce lateral diffusion of boron impurities into adjacent channel regions for application where a boron impurity is used as a p-type impurity implant for the creation of Lightly Doped Diffusion (LDD) regions for a PMOS device".

It is clear that both steps of creating LDD regions (NLDD and PLDD) can be followed by an anneal step while it may be of advantageous to create a PLDD region that penetrates the surface of the substrate to a known and limited depth such as about 1500 Angstrom.

FIG. 4 shows the cross section of FIG. 3 after a second layer 32 of top oxide has been deposited. Methods and processing conditions that can be used for the deposition of the layer 32 as a second layer of top oxide have previously been highlighted and can be beneficially applied for the steps that is represented in cross section in FIG. 4. These conditions therefore do not need to be further highlighted at this time.

FIG. 5 shows a final cross section of the process of the invention, second gate spacers 32 have been formed on the sidewalls of the NMOS gate electrode 11 and the PMOS gate electrode 13 using conventional and previously highlighted processing methods and conditions. The etch of layer 22, FIG. 4, the create the gate spacers 32, stops on oxide liner layer 20, removing the silicon nitride from above this layer 20 where layer 21 of nitride is note protected from the etch by the gate spacers 32. Layer 21 of silicon nitride is also removed from the surface of the gate electrodes 11 and 13 but remains in place underlying gate spacers 32 and interfacing between the gate spacers 32 and the body 14/18 of NMOS gate electrodes 11 and 16/18 of PMOS gate electrode 13.

The advantages that are provided by the invention can be summarized as follows:

anneal of the source and gate implants of the NMOS and PMOS device is performed prior to LDD implant of the PMOS device, eliminating the effect of boron (p-type) impurity) to diffuse into the surrounding silicon as a consequence of the anneal temperatures of the S/C anneal the PLDD regions are further removed in a lateral direction along the surface of the substrate from the PMOS gate electrode, placing a distance between the surface of the substrate over which the PMOS devices is created and the PLDD regions in the surface of the substrate. This makes the possibility of diffusion of PLDD impurities into the surface region of the substrate underneath the gate electrode that much more unlikely there is adequate surface area on the surface of the substrate between the gate spacers of the PMOS and NMOS devices and the surface of the STI region so that contacts to the S/D regions can be established without causing a concern of such a contact making contact with the surface of the STI region the steps of impurity implant of the invention are compatible with self-aligned implants, using the gate electrode for purposes of self-alignment S/D anneal is performed while no layers of photoresist are present over the surface of the construct; this makes the process of the invention compatible with the objective of reducing lateral dopant diffusion in the surface of the substrate.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating Lightly doped Diffusion regions self-aligned with a PMOS device, comprising the steps of:

providing a silicon substrate, said substrate having been provided with at least one NMOS gate electrode and at least one PMOS gate electrode on the surface thereof, said at least one NMOS and at least one PMOS device being separated by a region of gate isolation created in the surface of said substrate, a Negative Lightly Doped Diffusion (NLDD) implantation self-aligned with said at least one NMOS gate electrode having been performed into the surface of said substrate, successive layers of oxide liner, etch stop material and first layer of top oxide having been deposited over the surface of the substrate including the surface of said gate electrodes;

etching said first layer of top oxide, creating first gate spacers on sidewalls of said gate electrodes, using said layer of etch stop material as an etch stop;

performing n-type Source/Drain (NS/D) and p-type Source/Drain (PS/D) implantations, said implantations being self-aligned with said at least one NMOS devices and said PMOS device respectively;

removing said first gate spacers from sidewalls of said at least one NMOS gate electrode and said at least one PMOS gate electrode, exposing the surface of said layer of etch stop material;

performing a Positive Lightly Doped Diffusion (PLDD) implantation, said PLDD implantation being self-aligned with said at least one PMOS devices, said PLDD implantation using boron as a source of ion impurities;

depositing a second layer of top oxide over the surface of the substrate, including the surface of said at least one PMOS gate electrode and said at least one PMOS gate electrode;

etching said second layer of top oxide, creating second gate spacers on sidewalls of said gate electrodes, using said layer of oxide liner as an etch stop layer; and etching said layer of etch stop material, using said layer of oxide liner as an etch stop layer.

2. The method of claim 1 wherein said layer of oxide liner is deposited to a thickness of between about 100 and 500 Angstrom.

3. The method of claim 1 wherein said layer of etch stop material comprises silicon nitride, deposited to a thickness of between about 2000 and 3000 Angstrom.

4. The method of claim 1 wherein said first layer of top oxide is deposited to a thickness between about 1000 and 5000 Angstrom.

5. The method of claim 1 wherein said second layer of top oxide is deposited to a thickness between about 1000 and 5000 Angstrom.

6. The method of claim 1 wherein said performing a PLDD implantation using boron as a source of ion impurities comprises implanting boron ($BF_2$) with an implantation energy within the range of between about 1 to 10 keV and a dose within the range of between about 1e14 to 5e15 atoms/cm$^2$.

7. The method of claim 1 with the additional step of annealing said NS/D and ND/D implantations, said annealing comprising a rapid thermal annealing in a temperature range of between about 600 and 800 degrees C. for a time between about 20 and 40 seconds at a pressure below about $10^{-6}$ Torr, said annealing to be performed after said NS/D and PS/D implantations have been performed.

8. The method of claim 1 with the additional step of annealing said Negative Lightly Doped Diffusion (NLDD) implantation performed into the surface of said substrate, said annealing to be performed immediately after said NLDD implantation has been provided.

9. The method of claim 1 with the additional step of annealing said Positive Lightly Doped Diffusion (PLDD) implantation into the surface of said substrate, said step to be performed prior to said step of depositing a second layer of top oxide over the surface of said layer of etch stop material.

10. The method of claim 1 wherein said step of performing a Positive Lightly Doped Diffusion (PLDD) implantation into the surface of said substrate comprises forming a lightly doped region of less than 1500 Angstrom thick.

11. A method of creating Lightly doped Diffusion regions self-aligned with a PMOS device, comprising the steps of:

providing a semiconductor substrate, said substrate having been provided with a Negative Channel Metal Oxide Semiconductor (NMOS) gate electrode in addition to having been provided with a Positive Channel Metal Oxide Semiconductor (PMOS) gate electrode, said NMOS gate electrode and said PMOS gate electrode being separated by a gate insulation layer created in the surface of said substrate;

performing a Negative Lightly Doped Diffusion (NLDD) implantation into the surface of said substrate, said NLDD being self-aligned with said NMOS gate electrode;

depositing a layer of oxide liner over the surface of said substrate, including the exposed surfaces of said NMOS and said PMOS gate electrode;

depositing a layer of nitride over the surface of said layer of oxide liner;

depositing a first layer of top oxide over the surface of said layer of nitride;

etching said first layer of top oxide, creating first gate spacers on sidewalls of said NMOS and PMOS gate electrodes, using said layer of nitride as an etch stop layer;

performing source and drain implantations for said NMOS and said PMOS gate electrodes, said source and drain implantations being self-aligned with said NMOS and said PMOS gate electrodes;

annealing said source and drain implantations;

removing said first gate spacers from sidewalls of said NMOS and said PMOS gate electrodes, using said layer of nitride as an etch stop layer, exposing the surface of said layer of nitride;

performing a Positive Lightly Doped Diffusion (PLDD) implantation into the surface of said substrate using boron as a source of ion impurities, said PLDD being self-aligned with said PMOS gate electrode;

depositing a second layer of top oxide over the surface of said layer of nitride;

etching said first layer of top oxide, creating second gate spacers on sidewalls of said NMOS and PMOS gate electrodes, using said layer of nitride as an etch stop layer; and etching said layer of nitride, using said layer of oxide liner as an etch stop layer, removing said layer of nitride from above said NMOS and PMOS gate electrodes, further removing said layer of nitride from above said layer of oxide liner where said second gate spacers do not overlay said layer of nitride.

12. The method of claim 11 wherein said layer of oxide liner is deposited to a thickness of between about 100 and 500 Angstrom.

13. The method of claim 11 wherein said layer of nitride is deposited to a thickness of between about 2000 and 3000 Angstrom.

14. The method of claim 11 wherein said first layer of top oxide is deposited to a thickness between about 1000 and 5000 Angstrom.

15. The method of claim 11 wherein said second layer of top oxide is deposited to a thickness between about 1000 and 5000 Angstrom.

16. The method of claim 11 wherein said performing a Positive Lightly Doped Diffusion (PLDD) implantation into the surface of said substrate using boron as a source of ion impurities comprises implanting boron ($BF_2$) with an implantation energy within the range of between about 1 to 10 keV and a dose within the range of between about 1e14 to 5e15 atoms/cm$^2$.

17. The method of claim 11 wherein said annealing said source and drain implantations comprises rapid thermal annealing in a temperature range of between about 600 and 800 degrees C. for a time between about 20 and 40 seconds at a pressure below about $10^{-6}$ Torr.

18. The method of claim 11 with the additional step of annealing said Negative Lightly Doped Diffusion (NLDD) implantation performed into the surface of said substrate, said annealing to be performed prior to said depositing a layer of oxide liner.

19. The method of claim 11 with the additional step of annealing said Positive Lightly Doped Diffusion (PLDD) implantation into the surface of said substrate, said step to be performed prior to said step of depositing a second layer of top oxide over the surface of said layer of nitride.

20. The method of claim 11 wherein said step of performing a Positive Lightly Doped Diffusion (PLDD) implantation into the surface of said substrate comprises forming a lightly doped region of less than 1500 Angstrom thick.

21. A method of manufacturing a semiconductor device, comprising the steps of:

providing a semiconductor substrate, forming first and second conductive gates on the surface of said substrate, said first and second conductive gates being separated by a region of electrical isolation in the surface of said substrate;

implanting impurities into the surface of the substrate, using the first gate as a mask, forming lightly doped diffusion regions self-aligned with said first gate;

successively depositing a layer of oxide liner followed by a layer of nitride followed by a first layer of top oxide over the surface of said substrate including exposed surfaces of said first and second conductive gates;

forming first oxide sidewall gate spacers on side surfaces of the first and second conductive gates and extending from said first and second conductive gates over the surface of said substrate, by etching said first layer of top oxide using said layer of nitride as an etch stop layer, said first oxide gate spacers overlying said layer of nitride;

implanting impurities into the surface of the substrate, using the first and second conductive gates and the sidewall spacers thereon as a mask, to form source and drain implantations for said first and second conductive gates;

annealing said source and drain implantations;

removing said first oxide sidewall gate spacers from above said layer of nitride;

implanting impurities comprising boron into the surface of the substrate, using the second gate as a mask, forming lightly doped diffusion regions self-aligned with said second gate;

depositing a second layer of top oxide over the surface of said layer of nitride;

forming second oxide sidewall gate spacers on side surfaces of the first and second conductive gates and extending from said first and second conductive gates over the surface of said substrate by etching said second layer of top oxide, said second oxide gate spacers overlying said layer of nitride; and etching said layer of nitride using said layer of oxide liner as an etch stop layer, said layer of nitride remaining in place underlying said second oxide sidewall gate spacers.

22. The method of claim 21 wherein said first conductive gate comprises a NMOS device and said second conductive gate comprises a PMOS device.

23. The method of claim 21 wherein said implanting impurities into the-surface of the substrate, using the first gate as a mask, forming lightly doped diffusion regions self-aligned with said first gate comprises implanting n-type impurities.

24. The method of claim 21 wherein said implanting impurities into the surface of the substrate, using the second gate as a mask, forming lightly doped diffusion regions self-aligned with said second gate comprises implanting boron as an impurity source.

25. The method of claim 21 wherein said implanting impurities comprising boron into the surface of the substrate, using the second gate as a mask, forming lightly doped diffusion regions self-aligned with said second gate comprises boron ($BF_2$) with an implantation energy within the range of between about 1 to 10 keV and a dose within the range of between about 1e14 to 5e15 atoms/cm$^2$.

26. The method of claim 21 wherein said implanting impurities into the surface of the substrate, using the first and second conductive gates and the sidewall spacers thereon as a mask, to form source and drain implantations for said first and second conductive gates comprises:

implanting n-type impurities using said first conductive gates and the sidewall spacers thereon as a mask; and implanting p-type impurities using said second conductive gates and the sidewall spacers thereon as a mask.

27. The method of claim 21 wherein said layer of oxide liner is deposited to a thickness of between about 100 and 500 Angstrom.

28. The method of claim 21 wherein said layer of nitride is deposited to a thickness of between about 2000 and 3000 Angstrom.

29. The method of claim 21 wherein said first layer of top oxide is deposited to a thickness between about 1000 and 5000 Angstrom.

30. The method of claim 21 wherein said second layer of top oxide is deposited to a thickness between about 1000 and 5000 Angstrom.

31. The method of claim 21 with the additional step of annealing said source and drain implantations, said additional step to be performed before said step of removing said first oxide sidewall gate spacers from above said layer of nitride.

32. The method of claim 31 wherein said annealing said source and drain implantations comprises rapid thermal annealing in a temperature range of between about 600 and 800 degrees C. for a time between about 20 and 40 seconds at a pressure below about $10^{-6}$ Torr.

33. A method of creating a CMOS semiconductor device having at least one NMOS device and at least one PMOS device, comprising the steps of:

providing a semiconductor substrate;

forming at least one NMOS gate electrode over the surface of said substrate and at least one PMOS gate electrode over the surface of said substrate, said least one NMOS gate electrode being separated from said least one PMOS gate electrode by a region of electrical insulation in the surface of said substrate;

selectively implanting a first n-type dopant into an NMOS device active region of the substrate self aligned with the NMOS gate electrode to form a first n-doped region in the NMOS active region;

depositing a layer of oxide liner over the surface of the substrate including exposed surfaces of the NMOS and PMOS gate electrodes;

depositing a layer of etch stop material over the surface of the layer of oxide liner;

forming first spacers on sidewalls of the NMOS gate and first spacers on sidewalls of the PMOS gate, using said layer of etch stop material as an etch stop;

selectively implanting a second n-type dopant into the NMOS active region using the first NMOS spacer as a mask, the second n-type dopant implantation forming, in the NMOS active region, a second n-doped region deeper than the first n-doped region;

selectively implanting a first p-type dopant into the PMOS active region using the first PMOS spacer as a mask, the first p-type dopant implantation forming, in the NMOS active region, a first p-doped region;

heating the substrate at a first temperature;

removing said first spacers from sidewalls of the NMOS gate and first spacers from sidewalls of the PMOS gate, using said layer of nitride as an etch stop layer;

selectively implanting as second p-type dopant into the PMOS active region using the first PMOS spacer as a mask, the second p-type dopant implantation forming, in the NMOS active region, a second p-doped region, said second p-doped region being less deep than said first p-doped region;

forming second spacers on sidewalls of the NMOS gate and first spacers on sidewalls of the PMOS gate, using said layer of nitride as an etch stop; and removing said layer of nitride from above the surface of the NMOS gate electrode and from above the surface of the PMOS gate electrode, further removing the layer of nitride from above the surface of the substrate where said layer of nitride is exposed, using said layer of oxide liner as an etch stop.

34. The method of claim 33 wherein said layer of oxide liner is deposited to a thickness of between about 100 and 500 Angstrom.

35. The method of claim 33 wherein said layer of etch stop material comprises nitride, deposited to a thickness of between about 2000 and 3000 Angstrom.

36. The method of claim 33 wherein said selectively implanting a second p-type dopant into the PMQS active region using the first PMQS spacer as a mask comprises implanting boron ($BF_2$) with an implantation energy within the range of between about 1 to 10 keV and a dose within the range of between about 1e14 to 5e15 atoms /cm².

37. The method of claim 33 wherein said heating the substrate at a first temperature comprises rapid thermal annealing in a temperature range of between about 600 and 800 degrees C. for a time between about 20 and 40 seconds at a pressure below about $10^{-6}$ Torr.

38. The method of claim 33 with the additional step of annealing said first n-type dopant selectively implanted into an NMOS device active region, said annealing to be performed prior to said depositing a layer of oxide liner.

39. The method of claim 33 with the additional step of annealing said second p-type dopant selectively implanted into the PMOS active region using the first PMOS spacer as a mask, said step to be performed prior to said step of forming second spacers on sidewalls of the NMOS gate and first spacers on sidewalls of the PMOS gate.

40. The method of claim 33 wherein said step of selectively implanting as second p-type dopant into the PMOS active region using the first PMOS spacer as a mask comprises forming a lightly doped region of less than 1500 Angstrom thick.

41. The method of claim 33 wherein said forming first spacers on sidewalls of the NMOS gate and first spacers on sidewalls of the PMOS gate, using said layer of etch stop material as an etch stop. comprises the steps of depositing a first layer of top oxide over the surface of said layer of etch stop material, etching said first layer of top oxide using said layer of etch stop material as an etch stop layer.

42. The method of claim 41 wherein said first layer of top oxide is deposited to a thickness between about 1000 and 5000 Angstrom.

43. The method of claim 33 wherein said forming second spacers on sidewalls of the NMOS gate and first spacers on sidewalls of the PMOS gate comprises the steps of depositing a second layer of top oxide over the surface of said layer of etch stop material, etching said second layer of top oxide using said layer of etch stop material as an etch stop layer.

44. The method of claim 43 wherein said second layer of top oxide is deposited to a thickness between about 1000 and 5000 Angstrom.

* * * * *

UNITED STATES PATENT AND TRADEMARK OFFICE
CERTIFICATE OF CORRECTION

PATENT NO. : 6,451,704 B1
DATED : September 17, 2002
INVENTOR(S) : Yelehmanyam Ramachandramurthy Pradeep et al.

It is certified that error appears in the above-identified patent and that said Letters Patent is hereby corrected as shown below:

<u>Title page,</u>
Item [75], delete "Madhudsudan Mukhopdhyay", and replace with
-- Madhudsudan Mukhopadhyay --.

Signed and Sealed this

Eighteenth Day of March, 2003

JAMES E. ROGAN
*Director of the United States Patent and Trademark Office*